(12) United States Patent
Matocha et al.

(10) Patent No.: US 7,521,732 B2
(45) Date of Patent: Apr. 21, 2009

(54) VERTICAL HETEROSTRUCTURE FIELD EFFECT TRANSISTOR AND ASSOCIATED METHOD

(75) Inventors: Kevin Sean Matocha, Rexford, NY (US); Vinayak Tilak, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 40 days.

(21) Appl. No.: 11/283,451

(22) Filed: Nov. 18, 2005

(65) Prior Publication Data

US 2007/0114567 A1    May 24, 2007

(51) Int. Cl.
*H01L 29/20* (2006.01)
(52) U.S. Cl. ................... 257/192; 257/194
(58) Field of Classification Search ........... 257/192, 257/194
See application file for complete search history.

(56) References Cited

U.S. PATENT DOCUMENTS

| | | | |
|---|---|---|---|
| 4,830,980 A | | 5/1989 | Hsieh |
| 4,974,038 A | * | 11/1990 | Delagebeaudeuf et al. .. 257/192 |
| 5,162,877 A | * | 11/1992 | Mori ............................ 257/25 |
| 5,276,340 A | * | 1/1994 | Yokoyama et al. .......... 257/194 |
| 5,473,176 A | | 12/1995 | Kakumoto |
| 5,847,414 A | | 12/1998 | Harris et al. |
| 5,929,467 A | | 7/1999 | Kawai et al. |
| 6,221,700 B1 | | 4/2001 | Okuno et al. |
| 6,674,101 B2 | | 1/2004 | Yoshida |
| 6,690,042 B2 | | 2/2004 | Khan et al. |
| 6,693,314 B2 | * | 2/2004 | Mitlehner et al. ............ 257/256 |

(Continued)

FOREIGN PATENT DOCUMENTS

WO    WO 2004/053206    6/2004

(Continued)

OTHER PUBLICATIONS

Saito et al, High Breakdown Voltage AlGaN-GaN Power-HEMT Design and High Current Density Switching Behavior, IEEE Transactions on Electron Devices, vol. 50, No. 12, pp. 2528-2531, Dec. 2003.

(Continued)

*Primary Examiner*—Jerome Jackson, Jr.
*Assistant Examiner*—Anthony Ho
(74) *Attorney, Agent, or Firm*—Richard A. DeCristofaro

(57) ABSTRACT

A vertical heterostructure field effect transistor including a first layer having a first material, and the first material having a hexagonal crystal lattice structure defining a first bandgap and one or more non-polar planes is provided. The transistor further includes a second layer that is adjacent to the first layer having a second material. Further, the second layer has a first surface and a second surface, and a portion of the second layer first surface is coupled to the surface of the first layer to form a two dimensional charge gas and to define a first region. The second material may have a second bandgap that is different than the first bandgap. Furthermore, the transistor may include a conductive layer that is disposed in the trench and is interposed between the first region and a second region that is not in electrical communication with the first region if no electrical potential is applied to the conductive layer, and an electrical potential applied to the conductive layer allows electrical communication from the first region to the second region.

24 Claims, 5 Drawing Sheets

U.S. PATENT DOCUMENTS

| | | |
|---|---|---|
| 6,853,006 B2 * | 2/2005 | Kataoka et al. ............... 257/77 |
| 6,878,593 B2 | 4/2005 | Khan et al. |
| 2004/0124435 A1 | 7/2004 | D'Evelyn et al. |
| 2005/0067630 A1 | 3/2005 | Zhao |
| 2005/0145883 A1 * | 7/2005 | Beach et al. ................ 257/194 |
| 2006/0022218 A1 | 2/2006 | Masumoto et al. |
| 2006/0057790 A1 | 3/2006 | Clarke et al. |

FOREIGN PATENT DOCUMENTS

| | | |
|---|---|---|
| WO | WO 2004/053208 | 6/2004 |
| WO | WO 2005/122232 | 12/2005 |

OTHER PUBLICATIONS

Gil, "Group III Nitride Semiconductor Compounds", Physics and Applications, Clarendon Press, pp. 54-59, 1998.

* cited by examiner

VERTICAL HETEROSTRUCTURE FIELD EFFECT TRANSISTOR AND ASSOCIATED METHOD

BACKGROUND

The invention includes embodiments that may relate to a heterostructure field effect transistor. The invention includes embodiments that may relate to a method of making and/or using heterostructure field effect transistor.

A field-effect transistor (FET) may be a transistor that relies on an electric field to control the conductivity of a "channel" in a semiconductor material. A FET, like all transistors, may be thought of as a voltage-controlled current source. Some FETs may use a single-crystal semiconductor wafer as the channel, or active region. A terminal in a FET may be one of a gate, a drain, or a source. The voltage applied between gate and source terminals may modulate the current between the source and the drain.

A HFET is a heterostructure field effect transistor, and may be called a HEMT for High Electron Mobility Transistor. A HEET or a HEMT may be a field effect transistor with a junction between two materials with different band gaps (i.e. a heterojunction) as the channel instead of an n-doped region. A conventional combination may include GaAs with AlGaAs. The effect of this junction is to create a thin layer where the Fermi energy may be above the conduction band, giving the channel very low resistance (or to put it another way, "high electron mobility"). This thin layer may be referred to as a two dimensional electron gas. As with other types of FETs, a voltage applied to the gate alters the conductivity of the thin layer.

However, a HFET having such structure is normally-on, that is, the HFET conducts current even in absence of any potential applied between the gate and the source electrode. Therefore, such HFETs are not effective in switching devices, such as inverters or converters.

It may be desirable to have a HFET, which is normally-on and has a low on-resistance. It may be desirable to have a switching device with properties that differ from the properties of available devices.

BRIEF DESCRIPTION

In one embodiment, a normally-off electronic device is provided. The device may include a heterostructure field effect transistor. The transistor may include a first layer having a first material, and the first material having a hexagonal crystal lattice structure defining a first bandgap and one or more non-polar planes. The transistor may further include a second layer that is adjacent to the first layer having a second material. Further, the second layer has a first surface and a second surface, and a portion of the second layer first surface is coupled to the surface of the first layer to form a two dimensional charge gas and to define a first region. The second material may have a bandgap that is broader than the first bandgap. Furthermore, the transistor may include a conductive layer that is disposed in the trench and is interposed between the first region and a second region that is not in electrical communication with the first region if no electrical potential is applied to the conductive layer, and an electrical potential applied to the conductive layer allows electrical communication from the first region to the second region.

In one embodiment, a device may include a heterostructure field effect transistor. The invention may include embodiments that relate to a switching device.

In one embodiment, a method of making a heterostructure field effect transistor may be provided. The method may include forming a trench in a surface of a first layer, where the trench may have a first wall and a second wall. The first layer may have a first material having a hexagonal crystal lattice structure defining one or more non-polar planes. The first layer may be about parallel to one or more of the non-polar planes. The method may further include disposing into the trench a second layer having a first surface and a second surface such that a first portion of the second layer first surface may be coupled to the surface of the first layer to form a two dimensional charge gas and to define a first region, and a second portion of the second layer may define a groove that is at least partially co-extensive with the trench. Further, the method may include disposing into the groove a conductive layer.

DRAWINGS

These and other features and aspects may be apparent in view of the detailed description and accompanying drawing figures in which like reference numbers represent parts that are substantially the same from figure to figure, wherein.

DETAILED DESCRIPTION

Figure 1:
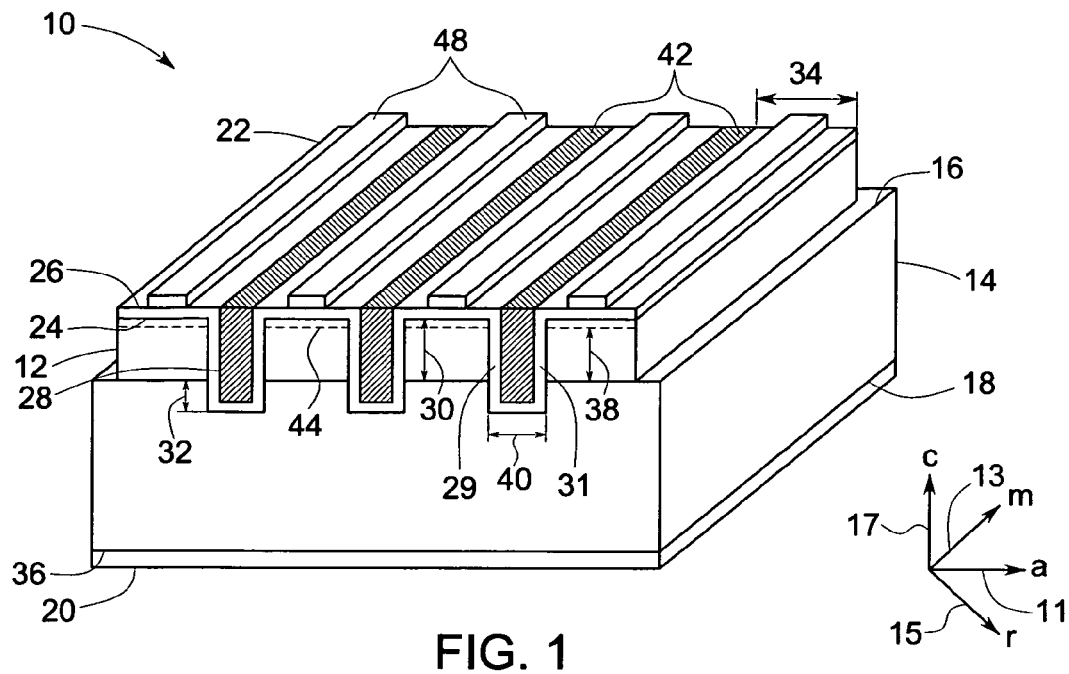
FIG. 1 is a perspective view of an embodiment of a normally-off heterostructure field effect transistor.

The invention may include embodiments that relate to a normally-off device, such as a field effect transistor. The invention may include embodiments that relate to alternate structures of the field effect transistor. The invention may include embodiments that relate to one or more devices including the same and associated methods.

Approximating language, as used herein throughout the specification and claims, may be applied to modify any quantitative representation that could permissibly vary without resulting in a change in the basic function to which it is related. Accordingly, a value modified by a term or terms, such as "about", may not to be limited to the precise value specified. In at least some instances, the approximating language may correspond to the precision of an instrument for measuring the value. Similarly, "free" may be used in combination with a term, and may include an insubstantial number, or trace amounts, while still being considered free of the modified term.

In embodiments of the invention, a device may include a first layer formed from a first material, and the first material may have a hexagonal crystal lattice structure defining a first bandgap and one or more non-polar planes. The device may include a second layer that is adjacent to the first layer. The second layer may include a second material having a second bandgap that differs from the first bandgap, for example the second material may have a different bandgap relative to the first material. The second layer may have a first surface and a second surface. Additionally, at least a portion of the second layer first surface may be coupled to a surface of the first layer to form a two dimensional charge gas and to define a first region. The coupling of such materials having differing bandgaps may induce a two dimensional charge gas at or near the interface.

A conductive layer may be interposed between the first region and a second region that is spaced from the first region. The device may be normally-off if no electrical potential is applied to the conductive layer. Normally-off indicates that a circuit is open from one predetermined point to another unless an external stimulus is provided to close the circuit and turn the device "on". For example, an electrical potential applied to the conductive layer may allow electrical communication from the first region to the second region.

As used herein, the term "normally-off" may refer to a device in which negligible or no current flows in the absence of any applied electrical potential to the conductive layer. For example, the amount of leakage current, that is, the current that may flow between the first and second regions of the device in the absence of any applied potential to the conductive layer, may be less than 10 micro amperes.

The device may have a relatively low on-resistance, and/or may have a relatively high blocking voltage. For example, the on-resistance of the device may be less than about 100 milli ohm centimeter square. In one embodiment, the on-resistance may be in a range of from about 100 milli ohm centimeter square to about 50 milli ohm centimeter square, from about 50 milli ohm centimeter square to about 25 milli ohm centimeter square, from about 25 milli ohm centimeter square to about 10 milli ohm centimeter square, from about 10 milli ohm centimeter square to about 5 milli ohm centimeter square, from about 5 milli ohm centimeter square to about 3 milli ohm centimeter square, or less than about 3 milli ohm centimeter square. The device may have a blocking voltage of greater than about 100 volts (V). In one embodiment, the blocking voltage may be in a range of from about 100 volts to about 250 volts, from about 250 volts to about 500 volts, from about 500 volts to about 750 volts, from about 750 volts to about 1000 volts, from about 1000 volts to about 1250 volts, from about 1250 volts to about 1500 volts, from about 1500 volts to about 2000 volts, from about 2000 volts to about 5000 volts, from about 5000 volts to about 25000 volts, from about 25000 volts to about 50000 volts, or greater than about 25,000 volts.

The device may include a conductive layer. In a device, such as HFET, the conductive layer may be a gate electrode. The conductive layer may include a conductive material such as transition metal. Suitable metals may include aluminum, copper, molybdenum or nickel. The conductive layer may have a thickness dimension that is less than about 10 micrometers. In one embodiment, the thickness may be in a range of from about 5 micrometers to about 10 micrometers, from about 2.5 micrometers to about 5 micrometers, from about 1.5 micrometers to about 2.5 micrometers, from about 0.75 micrometers to about 1.5 micrometers, or less than about 0.75 micrometers.

In embodiments of the invention, the first layer may include a first material, such that the first material may have a hexagonal crystal structure. The hexagonal crystal structure may define one or more non-polar planes and polar planes. A non-polar plane of a hexagonal crystal structure may be defined as a plane that may not have a polarization charge. The hexagonal crystal lattice structure may define non-polar planes, such as a-plane, m-plane, or both. In one embodiment, these planes may be oriented at an angle of 60 degrees relative to the closest plane. For example, m-plane may be oriented at an angle of 30 degrees relative to the a-plane. Contrary to the non-polar planes, polar planes may be defined as planes, which may have a polarization charge. The polar plane, such as a c-plane, may be oriented at an angle of 90 degrees relative to the non-polar planes. When a polar plane, such as the c-plane, of the crystal lattice contacts a substrate having a different bandgap to form a heterostructure, the two dimensional charge gas may be induced at the heterostructure interface. When the non-polar plane of the crystal lattice contacts a substrate having a different bandgap, the two dimensional charge gas may not be formed at the heterostructure interface, due to absence of the polarization charges.

The first material may include one or more nitrides of a group III metal, such as aluminum, indium, or gallium. In one embodiment, the first material may include gallium nitride. The bandgap of the first material may be in a range of from about 0.7 electron volts to about 2 electron volts, from about 2 electron volts to about 3.4 electron volts, or from about 3.4 electron volts to about 6.2 electron volts.

The first material may include one or more dopants. If the first layer is p-doped, the dopants may include magnesium, or carbon, or both. If the first layer is n-doped, the dopants may include silicon, magnesium, oxygen, carbon, calcium, iron or combinations of two or more thereof. The density of the two dimensional charge gas may be controlled by controlling the number of free charges in the doped first layer. That is, the density of the two dimensional charge gas may be controlled by controlling the doping concentration of the first layer.

The dislocation density of the first layer may be in a range of from about 1 per centimeter square to about $10^6$ per centimeter square, from about $10^6$ per centimeter square to about $10^8$ per centimeter square, and from about $10^8$ per centimeter square to about $10^9$ per centimeter square, from about $10^9$ per centimeter square to less than about $10^{11}$ per centimeter square. The higher values of dislocation density may result in leakage currents, thereby reducing the efficiency of the device.

The thickness of the first layer may be in a range of from about 1 micrometer to about 2 micrometers, from about 2 micrometers to about 5 micrometers, and from about 5 micrometers to about 10 micrometers. In one embodiment, the thickness of the first layer may be selected with reference to the dimensions of the conductive layer.

In embodiments of the invention, the second layer first surface may be coupled to a surface of the first layer to define a two dimensional charge gas. The second layer may include a second material. The second material may have a higher bandgap than the first material. The difference in the bandgap of the first and second materials may act as a potential barrier. The potential barrier may provide quantum confinement of charges, such as electrons and holes, to form a two dimensional charge gas. The two dimensional charge gas may form at the interface between the two layers, at least one of which defines a polar plane, or a plane having polarization charges.

The bandgap of the second layer may be in a range from about 3.4 electron volts to about 4.5 electron volts, from about 4.5 electron volts to about 5.5 electron volts, from about 5.5 electrons volt to less than about 6.2 electron volts. The layers may have a difference in the bandgap in a range of from about 2.5 electron volts to about 2.8 electron volts, from about 2.8 electron volts to about 3.5 electron volts, or from about 3.5 electron volts to less than about 5.5 electron volts.

The second material may include one or more semiconductor materials. Suitable semiconductor materials may include group m metal nitrides, such as nitride of aluminum, indium, gallium, or a combination of two or more thereof. In one embodiment, the second material may include aluminum gallium nitride. In one embodiment, the second material may include silicon carbide. In some embodiments, the material may be selected with reference to the material properties, such as lattice constant and coefficient of thermal expansion (CTE). Such selection may provide a match between the first and second materials to reduce occurrences of defects, such as micro-cracks caused by lattice mismatch, or difference in CTE.

The thickness of the second layer may vary from about 100 Angstroms to about 200 Angstroms, from about 200 Angstroms to about 400 Angstroms, from about 400 Angstroms to less than about 500 Angstroms. In one embodiment, the thickness of the second layer may be about 100 Angstroms.

In embodiments of the invention, the second layer may be doped. The second layer may be n-doped to provide two dimensional electron gas at the interface of the first layer and the regions of the second layer. In one embodiment, the dopants may include silicon, oxygen, or both. Alternatively, the second layer may be p-doped to provide two dimensional hole gas at the interface of first and second regions and the first layer. In one embodiment, the dopants may include one or more of magnesium, carbon, calcium, or a combination of two or more thereof.

In some embodiments, a portion of the second layer may be doped. Such doping may induce two dimensional charge gas at the interface of the first layer and the portion of the second layer that is doped. For example, a portion of the second layer top surface, that is, the surface opposite the surface coupled to the first layer, may be doped. A portion of the second layer lying between the second layer second surface and up to a predetermined thickness, as measured from the second layer second surface, may be doped. The doping may produce free charges in the second layer to induce two dimensional charge gas at the interface of the first and second layers. The thickness of the doping region, or depth of doping penetration, as measured from the second surface may be less than about 50 Angstroms, or in a range of from about 50 Angstroms to about 100 Angstroms, from about 100 Angstroms to about 200 Angstroms, from about 200 Angstroms to about 300 Angstroms, greater than about 300 Angstroms. Doping concentration may be greater than about $10^{19}$ per centimeter cube, or in a range of from about $10^{19}$ per centimeter cube to about $10^{20}$ per centimeter cube.

A portion of the second layer having the doped portion may then be separated from the second layer. The interface of the second layer with the first layer in this separated portion may not inherently induce a two dimensional charge gas. This may be due to absence of free charges in that particular region of the second layer. For example, a part of the doped portion may be separated from the region of the second layer which may be coupled to the conductive layer, so that there will be no two dimensional charge gas at the interface between the first layer and the region of the second layer employing the conductive layer. Upon application of potential, the two dimensions charge gas beneath the first and second regions may extend to cover the region below the conductive layer.

The second layer may have a third region. A portion of the first layer may be coupled to the third region. The third region may be interposed between, and adjacent to, the first and the second regions. In one embodiment, the first region may communicate with the second region via the third region in response to the electrical potential being applied to the conductive layer.

The conductive layer may be directly coupled to a portion of the third region. That is, the conductive layer may be placed between the first and second regions of the second layer.

A dielectric material may be disposed between the conductive layer and one or more of the first, second, and third regions. The dielectric material may insulate the conductive layer from the second layer. Insulation may reduce or prevent any leakage currents from the conductive layer. Insulation may facilitate application of higher potentials at the conductive layer while preventing adverse effects, such as leakage current, which may otherwise be produced upon application of high potentials. For example, the dielectric material reduces or prevents leakage currents upon application of potential above 1 volt. The thickness of the dielectric material may be relatively high to prevent any leakage currents at the conductive layer while maintaining low on-resistance. The dielectric material may be thick enough to insulate the conductive layer from the second layer. The dielectric layer may be thick enough to prevent tunneling of electrons or holes between the conductive layer and the second layer. The tunneling may increase leakage currents at the conductive layer. The thickness of the dielectric material may be more than about 100 Angstroms. The thickness of the dielectric material may be in a range of from about 100 Angstroms to about 500 Angstroms, from about 500 Angstroms to about 1000 Angstroms, from about 1000 Angstroms to about 2000 Angstroms.

The dielectric material may include one or more of silicon nitride, silicon dioxide, barium strontium titanate, magnesium oxide, gallium sulphide, oxides of rare earth elements, such as gallium, scandium, selenium, hafnium, or a combination of two or more thereof. In one embodiment, the dielectric material may be deposited using metal organic chemical vapor deposition (MOCVD).

The first and second regions of the second layer second surface may be disposed in alternate arrangements with respect to each other. In some embodiments, the first region may be parallel to, and co-planar with, the second region, as will be described in detail below with respect to various illustrated embodiments of FIGS. 9-10.

Partitioning the second layer, which may have an otherwise planar surface, may form the first region and the second region. Partitioning may include etching or cutting a channel from the second layer. The first region may be parallel to and co-planar with the second region. Alternatively, the first region may be parallel to but not co-planar with the second region. In embodiments, the first region may be non-parallel and non co-planar with the second region. For example, the second layer may include two physically separate regions which may be coupled to the first layer as first and second regions.

In one embodiment, the second layer second surface may be discontinuous and may define a recess that extends through the second layer. The first and second regions may be identified and may be laterally spaced apart from each other, by the recess.

In one embodiment, the first layer surface may define a trench having a first wall and a second wall, such structures may be referred to as a vertical heterostructure field effect transistor. A portion of the second layer may be coupled to the first layer surface outside the trench and another portion of the second layer may be co-extensive with the first layer surface that defines the trench. In this embodiment, the first region may be co-extensive with a portion of the second layer that is coupled to the first layer surface outside the trench, and the third region may be co-extensive with at least a portion of the trench first wall and/or the trench second wall. The conductive layer may be disposed in the trench. The second region may not be in electrical communication with the first region if no electrical potential is applied to the conductive layer, and an electrical potential applied to the conductive layer may allow electrical communication from the first region to the second region.

The first and second regions may be formed by etching away a part of the first layer to define first and second walls, respectively. Subsequently, the second layer may be conformally grown or disposed in the trench. In one embodiment, the second layer may be epitaxially grown in the trench. As illustrated in the embodiments of FIGS. 1-6, the first and second walls may be mutually parallel. As illustrated in embodiment of FIGS. 7-8, the first and second walls may be non-parallel to each other, and oriented to define a non-polar plane, that is, an m-plane or an r-plane of the first layer. The conductive layer may be disposed inside such a trench in the form of a pyramid.

Further, the device may include more than one trench. Additionally, one or more trench walls may have a curved profile. In embodiments of the invention, the recess or the trench may be formed by forming a groove in the second layer. In one embodiment, the portion of the second layer may be removed by etching away the portion of the second layer. The device may have at least one trench wall that defines a plane that may be skewed from a plane defined by another trench wall.

The conductive layer may be a gate electrode, where the gate electrode may be co-extensive with the trench. The gate electrode may or may not be in physical contact with the trench walls. For example, as noted above, a dielectric material may insulate the gate electrode from the trench wall.

Alternatively, the third region may be perpendicular or skew relative to the a-plane. For example, the third region may be skew in the cases where first and second regions are either non co-planar or non-parallel.

The device may further include a doped semiconductor substrate coupled to at least a portion of the second layer first surface to define a fourth region. The semiconductor substrate may act as a voltage blocking layer. The blocking voltage of a material may be defined as a maximum voltage that a material may withstand before breaking down. A material having different bandgap may have a higher blocking voltage. The blocking voltage of the device may be in a range of from about 100 volts to about 250 volts, from about 250 volts to about 500 volts, from about 500 volts to about 750 volts, from about 750 volts to about 1000 volts, from about 1000 volts to about 1250 volts, from about 1250 volts to about 1500 volts, from about 1500 volts to about 2000 volts, from about 2000 volts to about 5000 volts, from about 5000 volts to about 25000 volts, from about 25000 volts to about 50000 volts, or greater than about 25,000 volts. Suitable materials may include one or more of sapphire, silicon, silicon carbide, gallium nitride, aluminum nitride, indium nitride, zinc oxide, lithium aluminum oxide, lithium gallium oxide, or a combination of two or more thereof. The substrate and the first layer may be oppositely doped, that is, if the substrate is n-doped, the first layer may be p-doped, and vice versa. In one embodiment, the fourth region may be electrically conductive and may be configured to conduct charge under the influence of electrical potential applied to the conductive layer.

A surface of the semiconductor substrate may define one or more recesses or grooves. Each recess may be positioned to match the positions of a trench in the first layer. In other words, a trench in the first layer may extend into the substrate. In these embodiments, a portion of the second layer may be coupled to an inner surface of the recess.

The semiconductor substrate may be coupled to at least a portion of a side of the second layer which is perpendicular to an a-plane direction. In these embodiments, under the applied potential, the two dimensional charge gas may pass through the substrate portion, which houses the second layer, to electrically connect the first region to the second region.

In one embodiment, the semiconductor substrate may be coupled to a surface of the first layer that is opposite to the surface that is coupled to the second layer. The semiconductor substrate may also be coupled to the second layer second surface. Accordingly, in such embodiments, the lattice constant of the semiconductor substrate and the first and/or second layer may be matched to reduce the number of surface defects. Surface defects may include micro-cracks formed at an interface with the substrate.

The device may include a silicon substrate. The silicon substrate may be coupled to the semiconductor substrate. The silicon substrate may provide mechanical support to the device.

The drain electrode may be coupled to the device. The drain electrode may be coupled to the surface of the substrate that is either on the same side or the opposite side of the surface that is coupled to the second layer. The source electrode may be coupled to the first layer or to the second layer second surface. In one embodiment, the first region may be co-extensive with the source electrode, and the second region may be co-extensive with the drain electrode. In absence of a potential applied to the gate electrode, there may be no current between the source and drain electrodes, that is, there may be no electrical communication between the first and second regions.

The drain electrode and the source electrode may be formed separately. The electrodes may be coupled to the device to provide Ohmic contacts. The drain electrode and the source electrode may be formed by depositing a metal on the device. Metal may be deposited on the device, by employing techniques, such as sputtering. Subsequently, the metal may be patterned or etched to form the electrodes.

FIG. 1 is a perspective view of an embodiment of a vertical heterostructure field effect transistor (HBFET) 10 when no external potential is applied. The HFET 10 may include a first layer 12 coupled to the first surface 16 of the substrate 14. The first layer defines a non-polar plane, as shown by reference numerals 11 and 13. The substrate 14 may further include a second surface 18 coupled to a drain electrode 20. The substrate may include a semiconductor, such as gallium nitride. The first layer 12 may have a surface that defines one or more trenches 28. In the illustrated embodiment, the first and second walls 29 and 31 of the trenches 28 may be parallel. The trenches 28 may have a portion 30 that extends through the first layer 12 and a portion 32 that extends into the substrate 14. The portions 30 and 32 of the trenches 28 may be aligned with respect to each other. Further, the first layer 12 may be coupled to a portion of the first surface 24 of the second layer 22 to define a first region 34 and to form a two dimensional charge gas 44. The second layer 22 may also include a second surface 26.

Further, a conductive layer 42 may be disposed within the trench 28. The conductive layer 42 may be co-extensive with at least a portion of the trench 28. In one embodiment, the conductive layer 42 may be a gate electrode. A portion of the second layer second surface 26 may be disposed adjacent to the conductive layer 42. Further, in the absence of an electrical potential applied to the conductive layer 42, the regions of the second layer first surface 24 that are coupled to the first layer 12, may define two dimensional charge gas 44. As illustrated, in the absence of an electrical potential applied to the conductive layer 42, the two dimensional charge gas 44 may exist only in the regions where the second layer first surface 24 meets the first layer along the polar plane directions. The HFET 10 may include a source electrode 48 coupled to the second layer second surface 24.

A second region 36 may be formed at the interface of the drain electrode 20 and the substrate 14, such that the conductive layer 42 may be interposed between the first and second regions 34 and 36. The second region 36 may not be in electrical communication with the first region 34 if no electrical potential is applied to the conductive layer 42.

Further, the HFET 10 may also include a third region 38. The third region 38 may be disposed between the first region 34 and the second region 36. At least a portion of the first layer 12 is coupled to the second layer first surface 24 to define the third region 38 interposed between, and adjacent to, the first region 34 and the second region 36. As illustrated, the third region 38 may be co-extensive with a portion of the walls of the trench 28. The third region may be perpendicular or skew relative to the one or more non-polar planes. The first region 34 may communicate with the second region 36 via the third region 38 in response to the electrical potential being applied to the conductive layer 42.

Figure 4:
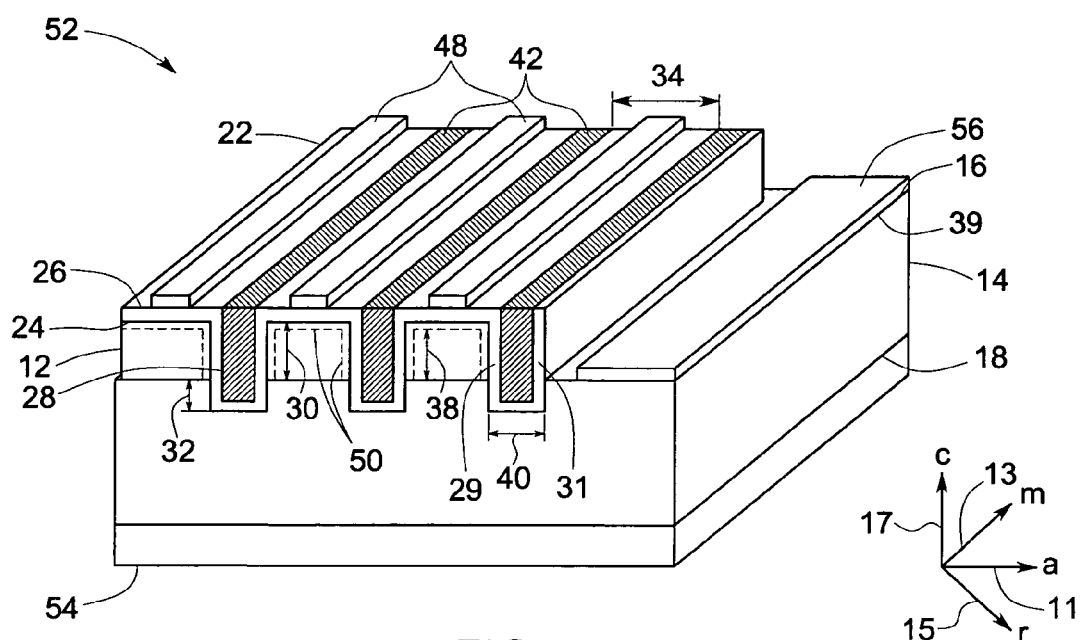
FIG. 4 is a perspective view of the heterostructure field effect transistor of FIG. 3 under the influence of an applied potential to the conductive layer.

In the illustrated embodiment, a portion of the second layer first surface 24 may be coupled to the substrate 14 at the side opposite to the drain electrode 20 to define a fourth region 40. As shown in FIG. 4, the first and second regions 34 and 36 may communicate with each other via the fourth region 40.

Figure 2:
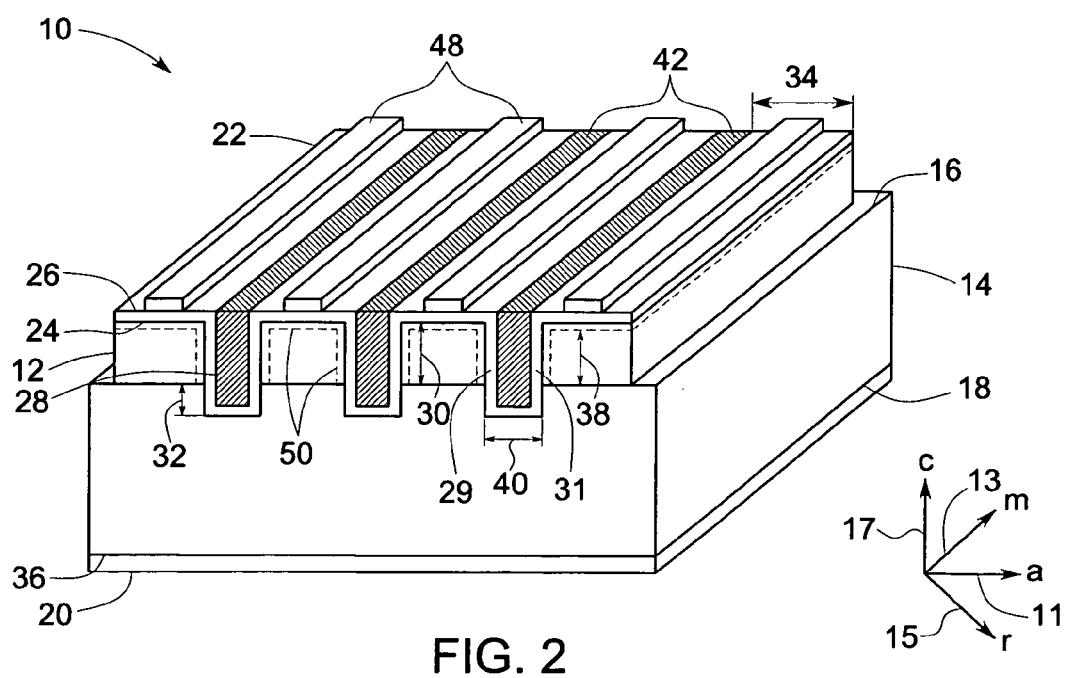
FIG. 2 is a perspective view of the heterostructure field effect transistor of FIG. 1 under the influence of an applied potential to the conductive layer.

FIG. 2 illustrates the HFET 10 of FIG. 1 when an electrical potential is applied to the conductive layer 42. As illustrated, under the influence of the electrical potential, the two dimensional charge gas 42 may continue from the first region 34 to the third region 36 to form a continuous two dimensional charge gas 50. Although not illustrated, the two dimensional charge gas 50 is then electrically communicative with the second region 36 through to the conductive path provided by the substrate 14 between the third region 38 and the second region 36.

Figure 3:
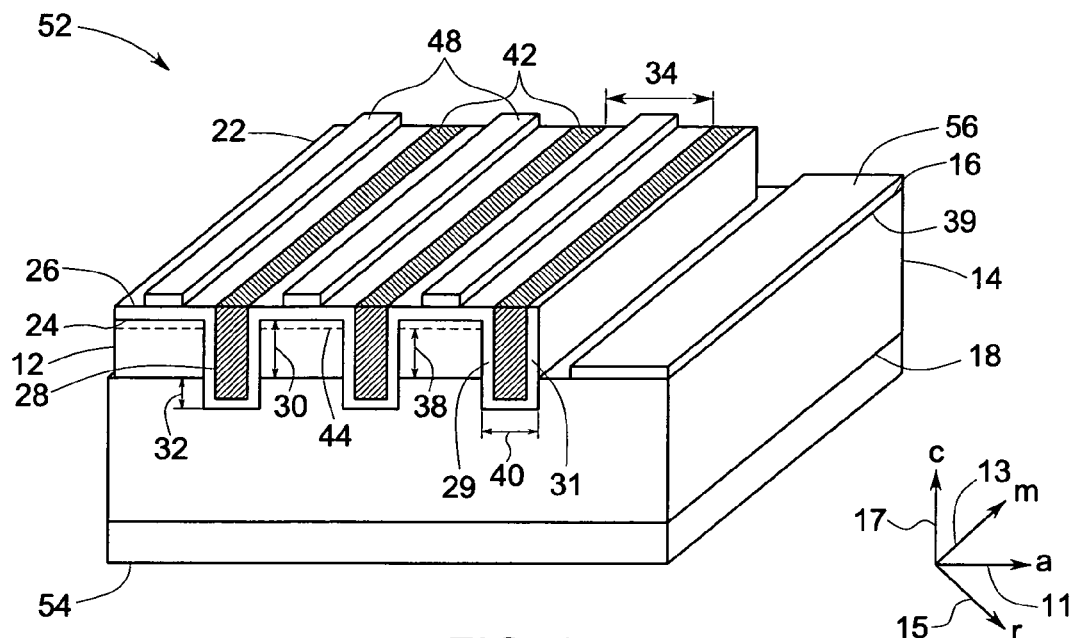
FIG. 3 is a perspective view of an embodiment of another normally-off heterostructure field effect transistor.

FIG. 3 illustrates an alternate embodiment of HFET 10 of FIG. 1. The HFET 52 may include a silicon substrate 54. The silicon substrate 54 may include silicon carbide.

Further, the HFET 52 may include a drain electrode 56 coupled to the substrate 14, such that the drain electrode 56 may be coupled to the same side of the substrate 14 as the first layer 12. In the illustrated embodiment, the second region 39 may be horizontally spaced apart from the first region 38 and may be co-extensive with the drain electrode 56.

As with FIG. 2, FIG. 4 illustrates the two dimensional charge gas 50 under the influence of electrical potential applied to the conductive layer 42. Under the influence of electrical potential applied to the conductive layer 42, current flows through the body of the substrate 14 close to the region of the first layer first surface 16 and the drain electrode 20.

Figure 5:
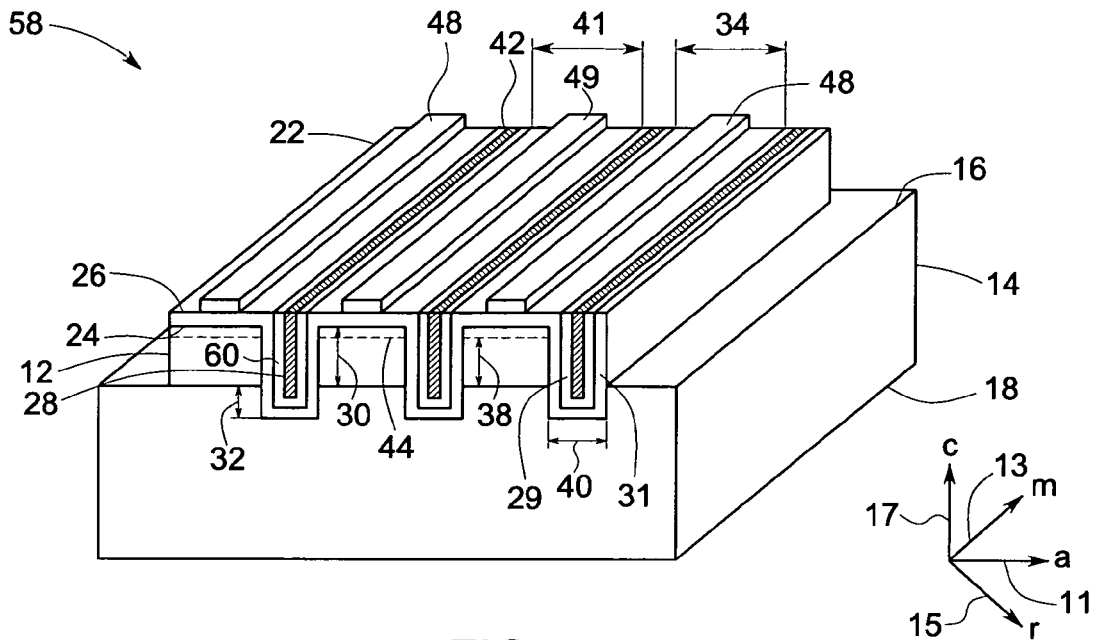
FIG. 5 is a perspective view of an embodiment of a normally-off heterostructure field effect transistor.

FIG. 5 illustrates a perspective view of an BFET 58 employing a dielectric layer 60. The dielectric layer 60 may be coupled to the conductive layer 42 and the second layer second surface 26 such that the conductive layer 42 may not be in direct contact with the second layer second surface 26.

As illustrated, the BFET 58 may include the source electrode 48 and the drain electrode 49 coupled to the second layer second surface 26, and located on either side of the conductive layer 42. In the illustrated embodiment, the first region 38 and the second region 41 may be spaced apart from each other, and located on either side of the conductive layer 42 and coextend with the source and drain electrodes, respectively.

Figure 6:
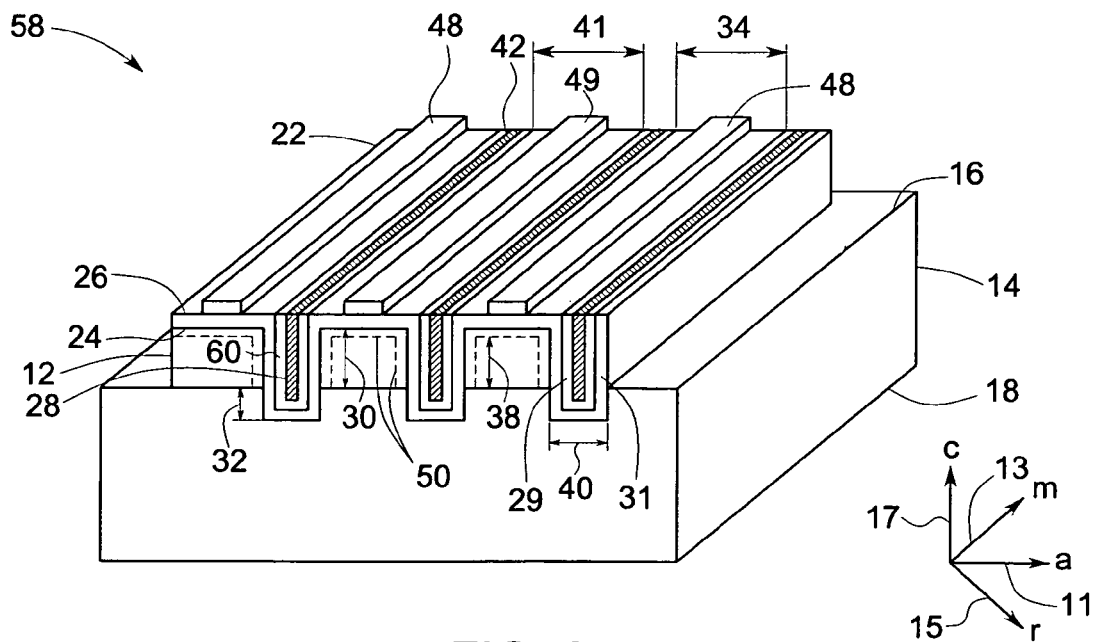
FIG. 6 is a perspective view of the heterostructure field effect transistor of FIG. 5 under the influence of an applied potential to the conductive layer.

FIG. 6 illustrates the two dimensional charge gas 50 under the influence of applied potential to the conductive layer 42.

Figure 7:
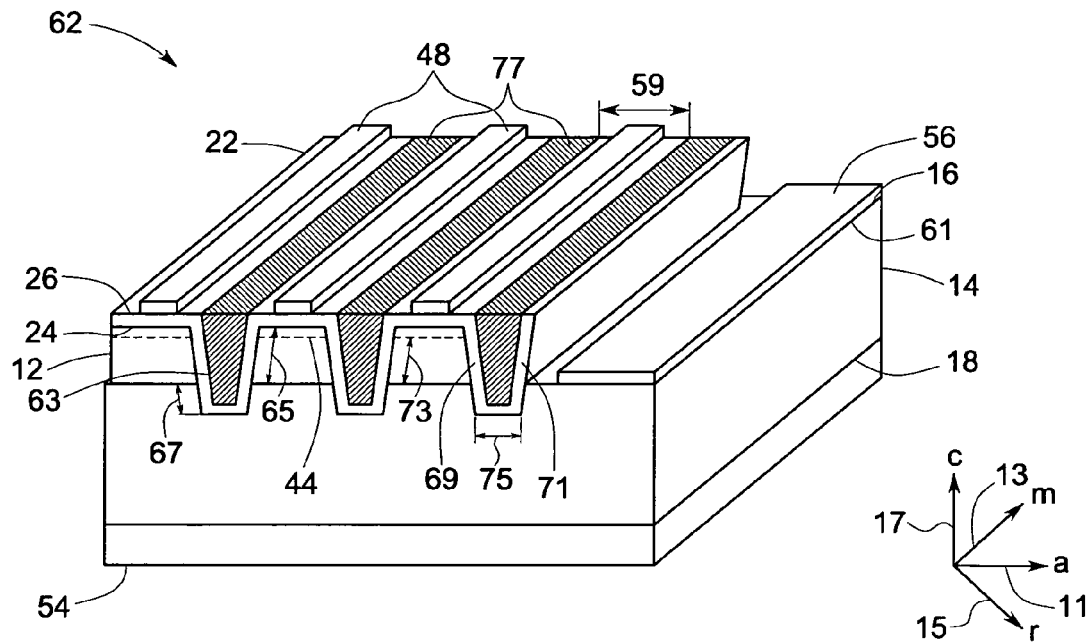
FIG. 7 is a perspective view of an embodiment of yet another normally-off heterostructure field effect transistor.

FIG. 7 illustrates an alternate embodiment of the HFET 52 of FIGS. 3. As with the embodiment illustrated in FIG. 3, the GFET 62 may employ a silicon substrate 54 which may be coupled to the substrate 14. The HFET 62 may include trenches 63 defined by the first layer surface. The trenches 63 may have a portion 65 that extends through the first layer 12 and a portion 67 that extends into the substrate 14. The interface of the first and second layer may induce two dimensional charge gas and define a first region 59. A second region 61 may be formed at the interface of the drain electrode. The first and second walls 69 and 71 of the trenches 63 may be non-parallel to each other. The first and second walls 69 and 71 may form an angle, other than 90 degrees, with the surface of the first layer 12. The angle formed between the surface of the first layer 12 and one or both of the first and second walls 69 and 71 may define a non-planar plane, such as, the m-plane 13 or the r-plane 15, in the first layer 12. The conductive layer 77 may be located in the trenches 63. The conductive layer 77 may be shaped to occupy the space in the trenches 63.

As with regions 38 and 40 of FIG. 3, the GFET 62 may include a third region 73 and a fourth region 75. In presence of electrical potential applied to the conductive layer 77, the regions 59, 61, 73 and 75 may be in electrical communication.

Figure 8:
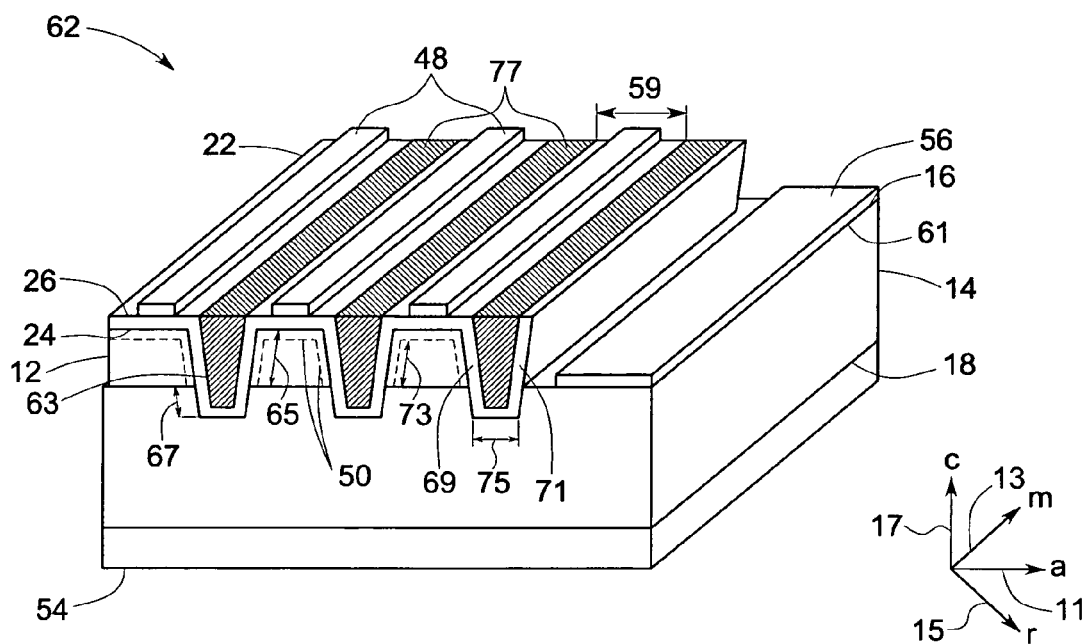
FIG. 8 is a perspective view of the heterostructure field effect transistor of FIG. 7 under the influence of an applied potential to the conductive layer.

FIG. 8 illustrates the two dimensional charge gas 50 under the influence of electrical potential applied to the conductive layer 77.

Figure 9:
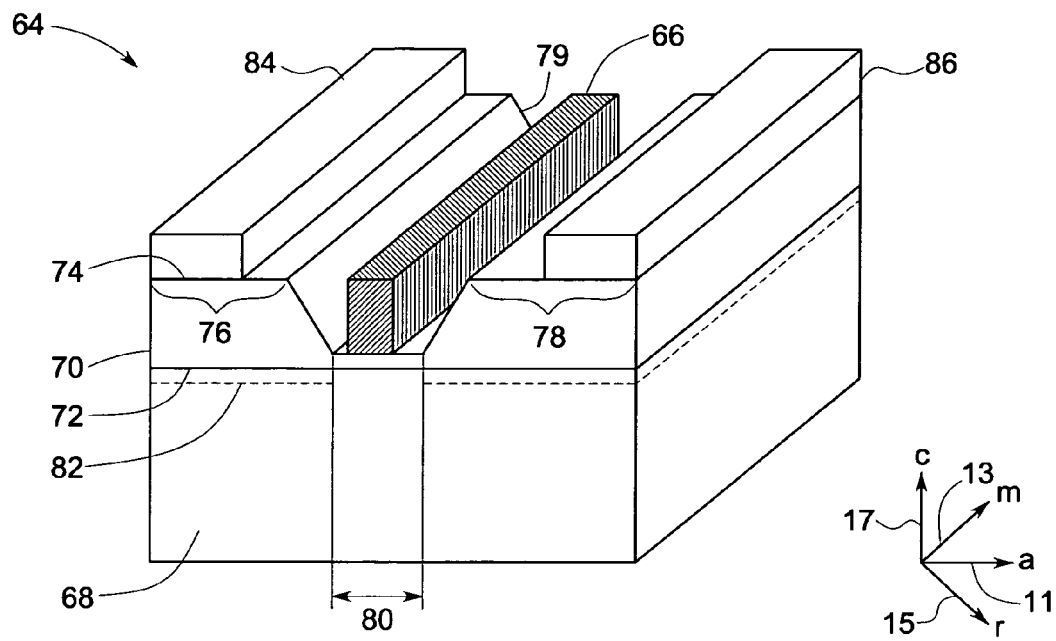
FIG. 9 is a perspective view of an embodiment of a normally-off heterostructure field effect transistor.

FIG. 9 illustrates an embodiment of a HFET 64 when no potential is applied across the conductive layer 66. The HFET 64 may include a first layer 68 being a crystal with a hexagonal structure having non-polar planes in the direction illustrated by reference numerals 11 and 13. The first layer 68 may be coupled to the second layer 70 at the second layer first surface 72. The second layer second surface 74 may include a first region 76 and a second region 78 separated by a region 79. The first region 76 may be spaced from the second region 78 by a region 80. As noted above, a portion of the second layer 70 may be doped so as to induce two dimensional charge gas as described below. This portion of the second layer may be within a thickness of about 100 Angstrom from the second layer second surface 74.

The third region 80 of the second layer 70 may be formed by separating a part of the second layer second surface 74 from the second layer 70. The third region 80 may be coupled to the conductive layer 66. In absence of any applied potential to the conductive layer 66, the interface between the first layer 68 and the region 80 of the second layer may be free from the two dimensional charge gas. Whereas, the two dimensional charge gas 82 may be present at the interface of the first layer 68 and the first and second regions. The presence of the charge may be caused by the doping of the portion 81 of the second layer 70. Additionally, a dielectric layer (not shown) may be disposed between the conductive layer 66 and the third region 80. Using a dielectric layer between the conductive layer and the second layer 70 reduces the leakage current during operation.

Further, the remaining two electrodes, the source and drain electrodes 84 and 86 may be coupled to each of the first and second regions 76 and 78.

Figure 10:
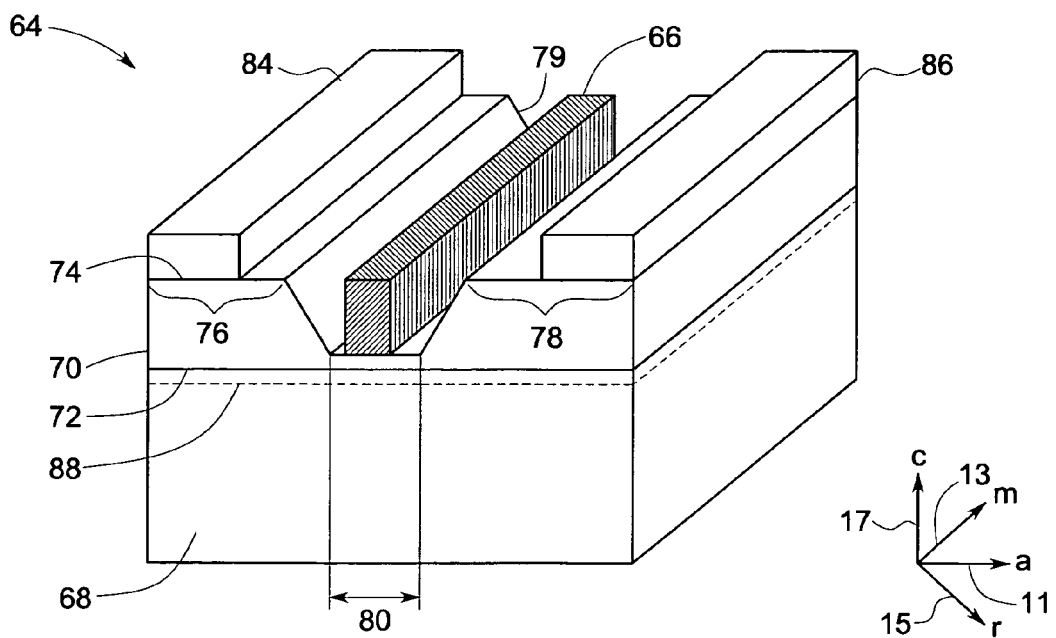
FIG. 10 is a perspective view of the heterostructure field effect transistor of FIG. 9 under the influence of an applied potential to the conductive layer.

As illustrated in FIG. 10, in the presence of applied potential to the conductive layer 66, the two dimensional charge gas 82 may extend to the region 80 and may form a continuous charge gas 88 between the source and drain electrodes 84 and 86.

Normally-off devices may be desirable for high power applications, such as high power, high temperature and high frequency applications in phased array radar systems. For switching devices, such as inverters or converters, a normally-off type device having a low-on resistance may be desirable, because of their low leakage current. The low leakage currents may result in improved efficiency and increased device reliability. Embodiments of the invention may be useful in, for example, a power diode, thyristor, power MOSFET, or an IGBT (insulated gate bipolar transistor).

EXAMPLE 1

Method of Forming a Normally-off Heterostructure Field Effect Transistor

A lateral normally-off aluminum gallium nitride-gallium nitride heterostructure field effect transistor HFET is formed. In this structure, a 3 micrometers undoped a-plane gallium nitride epilayer is formed on a substrate. Subsequently, 25 nanometers $Al_{0.3}Ga_{-0.7}N$ barrier layer is epitaxially grown on the a-plane gallium nitride layer. The aluminum gallium nitride layer includes a silicon delta-doped region which is located about 15 nanometers from the aluminum gallium nitride-gallium nitride interface. Next, a recess is etched in the aluminum gallium nitride layer to form a gate region approximately 10 nanometers deep, thus etching through the silicon delta-doped region in the aluminum gallium nitride layer. Next, metallization is done to deposit the conductive material of the gate. Subsequently, source and drain Ohmic contacts are formed. Since the aluminum gallium nitride-gallium nitride interface is on the a-plane, no polarization charges are present to induce a two-dimensional electron gas on the interface. However, the presence of the silicon delta-doped region in the aluminum gallium nitride layer under the source and drain electrodes provides the source of charge to induce an electron sheet charge at the interface. By using a gate recess through the silicon delta-doped region in the gate region, no electron charge is induced below the gate region, thus providing normally-off operation.

EXAMPLE 2

Method of Forming a Normally-off Heterostructure Field Effect Transistor Employing a Dielectric Layer A normally-off heterostructure field effect transistor is formed. The a-plane gallium nitride and aluminum gallium nitride layers are formed as described in the previous example. Subsequent to forming the recess for the gate electrode, a dielectric layer of 15 nanometers is formed on the aluminum gallium nitride layer by low-pressure chemical vapor deposition (LPCVD). This dielectric layer may be silicon dioxide. The metal gate electrode is formed on top of the dielectric. Next, the dielectric is etched away in the source and drain regions, and Ohmic contacts are formed to the source and drain. Using a dielectric between the gate electrode and the aluminum gallium nitride layer reduces gate leakage current during operation with positive gate-source bias voltages.

EXAMPLE 3

Method of Forming Normally-off Heterostructure Field Effect Transistor Employing a Ion-implanted Source and Drain Electrodes In another embodiment, a lateral normally-off MOS-BFET is formed with Si-implanted source and drain contact regions. As in the previous embodiments, the a-plane gallium nitride and aluminum gallium nitride layers are formed by epitaxy. Next, the source and drain regions are ion-implanted using Silicon. Then, the aluminum gallium nitride surface is capped with a material such as aluminum nitride or silicon oxide and is annealed at 1400 degrees Celsius and 100 kilo bar at nitrogen overpressure for 30 minutes. The capping layer is then removed, and the surface is further processed as in the previous embodiment. The use of the silicon implanted source and drain regions provide a low resistance Ohmic contact to the channel layer.

EXAMPLE 4

Method of Forming a Vertical Heterostructure Field Effect Transistor

In another embodiment, a vertical aluminum gallium nitride-gallium nitride vertical heterostructure field effect transistor is formed. On a substrate, a 3 micrometers n-type gallium nitride layer is formed with the top planar surface being the gallium crystal face of the c-plane. Next, a 1 micrometer, undoped or p-type doped gallium nitride layer is epitaxially grown on the gallium nitride layer. Trenches are then formed in the gallium nitride to a depth of 1.2 microns where the vertical faces of the trenches are the a-plane of gallium nitride. Next, a conformal $Al_{0.3}Ga_{0.7}N$ layer is epitaxially grown on these gallium nitride trenches. This $Al_{0.3}Ga_{0.7}N$ layer is 25 nanometers thick and is undoped. Next, the trenches are filled with a metal gate electrode. The source contact is formed at the top of the mesas, on top of the $Al_{0.3}Ga_{0.7}N$ layer, and the drain contact is formed either to the back of the substrate, or to the gallium nitride n-type layer. The channel region of the transistor is the interface of the aluminum gallium nitride and gallium nitride layers along the sidewall of the trench, oriented to the a-plane. Since no polarization charges are present on the a-plane crystal faces, no source of electrons is present to form a two-dimensional electron gas in the channel region, thus the device is normally off.

EXAMPLE 5

Method of Forming a Vertical Heterostructure Field Effect Transistor Employing a Dielectric As described with regard to Example 4, 3 micrometers n-type gallium nitride layer is deposited, trenches are formed, and an aluminum gallium nitride barrier is conformally deposited. After depositing the barrier layer, a 15 nanometers thick dielectric layer is formed on the barrier layer by low-pressure chemical vapor deposition (LPCVD). This dielectric layer may be silicon dioxide. Next, the trenches are filled with a metal gate electrode. The dielectric is then etched away from the source and drain contact regions and the source and drain contacts are formed as described in the previous embodiment. Using a dielectric between the gate electrode and the aluminum gallium nitride layer reduces gate leakage current during operation with positive gate-source bias voltages.

The foregoing examples are merely illustrative of some of the features of the invention. The appended claims are intended to claim the invention as broadly as it has been conceived and the examples herein presented are illustrative of selected embodiments from a manifold of all possible embodiments. Accordingly it is Applicants' intention that the appended claims are not to be limited by the choice of examples utilized to illustrate features of the present invention. As used in the claims, the word "comprises" and its grammatical variants logically also subtend and include phrases of varying and differing extent such as for example, but not limited thereto, "consisting essentially of" and "consisting of." Where necessary, ranges have been supplied, those ranges are inclusive of all sub-ranges there between. It is to be expected that variations in these ranges will suggest themselves to a practitioner having ordinary skill in the art and where not already dedicated to the public, those variations should where possible be construed to be covered by the appended claims. It is also anticipated that advances in science and technology will make equivalents and substitutions possible that are not now contemplated by reason of the imprecision of language and these variations should also be construed where possible to be covered by the appended claims.

The invention claimed is:

1. A vertical heterostructure field effect transistor, comprising:
   an n-type first metal nitride layer having a first bandgap;
   an undoped second metal nitride layer disposed on a surface of the n-type first metal nitride layer and having a second bandgap;
   and a third metal nitride layer disposed on a surface of the undoped second metal nitride layer and having a third bandgap that differs from the first bandgap and the second bandgap,
   wherein an interface of the third metal nitride layer and the first metal nitride layer forms a 2D electron gas at a first region, and the first region is in electrical communication with a first electrode, and the first electrode is reversibly electrically isolated from a second electrode that is in electrical communication with a second region, and
   an interface of the third metal nitride layer and the second metal nitride layer defines a third region interposed between the first region and the second region, and in which a 2D electron gas is capable of forming in response to a voltage potential applied to a proximate gate electrode, and
   the formation of the 2D electron gas in the third region reversibly provides electrical communication of the first region with the second region, wherein the sum total of the first region, the second region, and the third region define an electrically conductive pathway or circuit that extends from the first electrode to the second electrode with the third region being a reversibly electrically-conductive, normally-off switch that blocks a flow of electricity from the first electrode to the second electrode if there is little or no electrical potential applied to the gate electrode, and that permits the flow of electricity from the first electrode to the second electrode if there is a sufficient electrical potential applied to the gate electrode, each of the first, second and third regions being a portion of the conductive pathway or circuit.

2. The transistor as defined in claim 1, wherein the third region is a portion of a surface of the undoped second metal nitride layer, and the surface is a non-polar plane.

3. The transistor as defined in claim 1, wherein first metal nitride layer comprises doped n-type gallium nitride.

4. The transistor as defined in claim 1, wherein third metal nitride layer comprises aluminum gallium nitride.

5. The transistor as defined in claim 1, further comprising the gate electrode, and the gate electrode comprises tin, nickel, molybdenum, or a combination of two or more thereof.

6. The transistor as defined in claim 1, further comprising a semiconductor substrate supporting the first metal nitride layer, and the semiconductor substrate comprises a nitride of one or more of aluminum, indium, or gallium.

7. The transistor as defined in claim 6, wherein the semiconductor substrate comprises gallium nitride.

8. The transistor as defined in claim 1, further comprising a semiconductor substrate supporting the first metal nitride layer, and the semiconductor substrate comprises silicon carbide, or sapphire, or both.

9. The transistor as defined in claim 1, further comprising a semiconductor substrate supporting the first metal nitride layer, and the semiconductor substrate comprises silicon, magnesium, oxygen, carbon, calcium, iron, or combinations of two or more thereof.

10. The transistor as defined in claim 1, wherein the first metal nitride layer comprises nitride of one or more of aluminum, indium, or gallium.

11. The transistor as defined in claim 1, wherein the first metal nitride layer is doped with silicon, magnesium, oxygen, carbon, calcium, iron, or combinations of two or more thereof.

12. The transistor as defined in claim 1, wherein the first metal nitride layer has a dislocation density of less than about $10^9$ per centimeter square.

13. The transistor as defined in claim 1, wherein the first metal nitride layer has a thickness of less than about 10 micrometers.

14. The transistor as defined in claim 1, wherein the second metal nitride layer comprises nitride of one or more of aluminum, indium, or gallium.

15. The transistor as defined in claim 1, wherein the second metal nitride layer comprises aluminum gallium nitride.

16. The transistor as defined in claim 1, wherein the second metal nitride layer has a thickness in a range of from about 100 Angstroms to about 500 Angstroms.

17. The transistor of claim 1, wherein the first electrode is a source electrode and the second electrode is a drain electrode.

18. The transistor as defined in claim 17, wherein the voltage across the source electrode and the drain electrode is zero when there is no current applied to the gate.

19. The transistor as defined in claim 17, further comprising a dielectric material disposed between the gate electrode and the third metal nitride layer.

20. The transistor as defined in claim 19, wherein the dielectric material comprises silicon nitride, silicon dioxide, barium strontium titanate, magnesium oxide, gallium sulphide, oxides of gallium, scandium, selenium, hafnium, or combinations of two or more thereof.

21. The transistor as defined in claim 19, where the dielectric material has a thickness in a range of from about 0.01 micrometers to about 1 micrometer.

22. The transistor as defined in claim 1, wherein an on-resistance of the transistor is in a range from about 0.1 milli ohms centimeter square to about 100 milli ohms centimeter square.

23. The transistor as defined in claim 1, wherein the blocking voltage of the transistor is in a range from about 100 volts to about 50000 volts.

24. A vertical heterostructure field effect transistor, comprising:

an n-type first metal nitride layer having a first bandgap and coupled to a first electrode disposed in a first region;

a second metal nitride layer disposed on a surface of the n-type first metal nitride layer and having a second bandgap;

and a third metal nitride layer disposed on an opposing surface of the second metal nitride layer and having a third bandgap that differs from the first bandgap and the second bandgap and coupled to a second electrode that is disposed in a second region; and the first electrode is reversibly electrically isolated from a second electrode, and the interface of the third metal nitride layer and the second metal nitride layer defines a third region interposed between the first region and the second region, and in which a 2D electron gas is capable of forming in response to a voltage potential applied to a proximate gate electrode, and the formation of the 2D electron gas in the third region reversibly provides electrical communication of the first electrode with the second electrode, and the second metal nitride layer is a homogeneous layer such that only the single second metal nitride layer separates the first metal nitride layer from the third metal nitride layer, wherein the sum total of the first region, the second region, and the third region define an electrically conductive pathway or circuit that extends from the first electrode to the second electrode with the third region being a reversibly electrically-conductive, normally-off switch that blocks a flow of electricity from the first electrode to the second electrode if there is little or no electrical potential applied to the gate electrode, and that permits the flow of electricity from the first electrode to the second electrode if there is a sufficient electrical potential applied to the gate electrode, each of the first, second and third regions being a portion of the conductive pathway or circuit.

* * * * *

UNITED STATES PATENT AND TRADEMARK OFFICE
CERTIFICATE OF CORRECTION

PATENT NO. : 7,521,732 B2  
APPLICATION NO. : 11/283451  
DATED : April 21, 2009  
INVENTOR(S) : Matocha et al.

Page 1 of 1

It is certified that error appears in the above-identified patent and that said Letters Patent is hereby corrected as shown below:

In Column 1, Line 22, delete "HEET" and insert -- HFET --, therefor.

In Column 5, Line 11, delete "m" and insert -- III --, therefor.

In Column 7, Line 59, delete "2500" and insert -- 25000 --, therefor.

In Column 8, Line 50, delete "(HBFET)" and insert -- (HFET) --, therefor.

In Column 9, Line 65, delete "BFET" and insert -- HFET --, therefor.

In Column 10, Line 3, delete "BFET" and insert -- HFET --, therefor.

In Column 10, Line 15, delete "GFET" and insert -- HFET --, therefor.

In Column 10, Line 32, delete "GFET" and insert -- HFET --, therefor.

In Column 12, Line 7, delete "MOS-BFET" and insert -- MOS-HFET --, therefor.

Signed and Sealed this

Thirtieth Day of June, 2009

JOHN DOLL  
*Acting Director of the United States Patent and Trademark Office*